United States Patent [19]

Ashley

[11] Patent Number: 5,565,038
[45] Date of Patent: Oct. 15, 1996

[54] INTERHALOGEN CLEANING OF PROCESS EQUIPMENT

[75] Inventor: Ethan Ashley, Santa Clara, Calif.

[73] Assignee: Intel Corporation, Santa Clara, Calif.

[21] Appl. No.: 701,193

[22] Filed: May 16, 1991

[51] Int. Cl.$^6$ .................. B08B 3/08; B08B 9/08
[52] U.S. Cl. .................. 134/2; 134/3; 134/21; 134/22.1; 134/37
[58] Field of Search .................. 134/2, 3, 21, 22.1, 134/37; 156/345

[56] References Cited

U.S. PATENT DOCUMENTS

| | | | |
|---|---|---|---|
| 4,749,440 | 6/1988 | Blackwood et al. | 134/3 |
| 4,975,144 | 12/1990 | Yamazaki et al. | 156/345 |
| 5,011,705 | 4/1991 | Tanaka | 134/19 |

FOREIGN PATENT DOCUMENTS

| | | | |
|---|---|---|---|
| 0128717 | 1/1988 | Japan | 156/345 |
| 0032538 | 2/1990 | Japan | 156/345 |

OTHER PUBLICATIONS

Ibbotson et al., "Selective Interhalogen Etching of Tantalum Compounds and Other Semiconductor Materials", Apr. 15, 1985, Applied Physics Letter, vol. 46, No. 8, pp. 794–796.

Ibbotson et al., "Plasmaless Dry Etching of Silicon with Fluorine-Containing Compounds", Nov. 15, 1984, Applied Physics Letter, vol. 56, No. 10, pp. 2939–2942.

Saito, et al., "Plasmaless Cleaning Process of Silicon Surface Using Chlorine Trifluoride", Mar. 19, 1990, Applied Physics Letter, vol. 56, No. 12, pp. 1119–1121.

*In-Situ Plasma Cleaning Of LPCVD Tubes* by David W. Benzing and Ching C. Tang, Benzing Technologies, Inc., Santa Clara, CA 35 pages.

*Primary Examiner*—Zeinab El-Arini
*Attorney, Agent, or Firm*—Blakely, Sokoloff, Taylor & Zafman

[57] ABSTRACT

An improved method and apparatus for removing accumulated films from processing equipment. Accumulated films are removed without disassembling the equipment and by introducing an interhalogen gas into the chamber where it reacts with the accumulated films while only slightly or not reacting at all with the processing chamber or its internal parts. The interhalogens and its products formed are volatile and are easily removed by a vacuum. The noncorrosive reaction takes place without needing a plasma and unlike HCl, the reaction take place from about room temperature to 300° C.

58 Claims, 1 Drawing Sheet

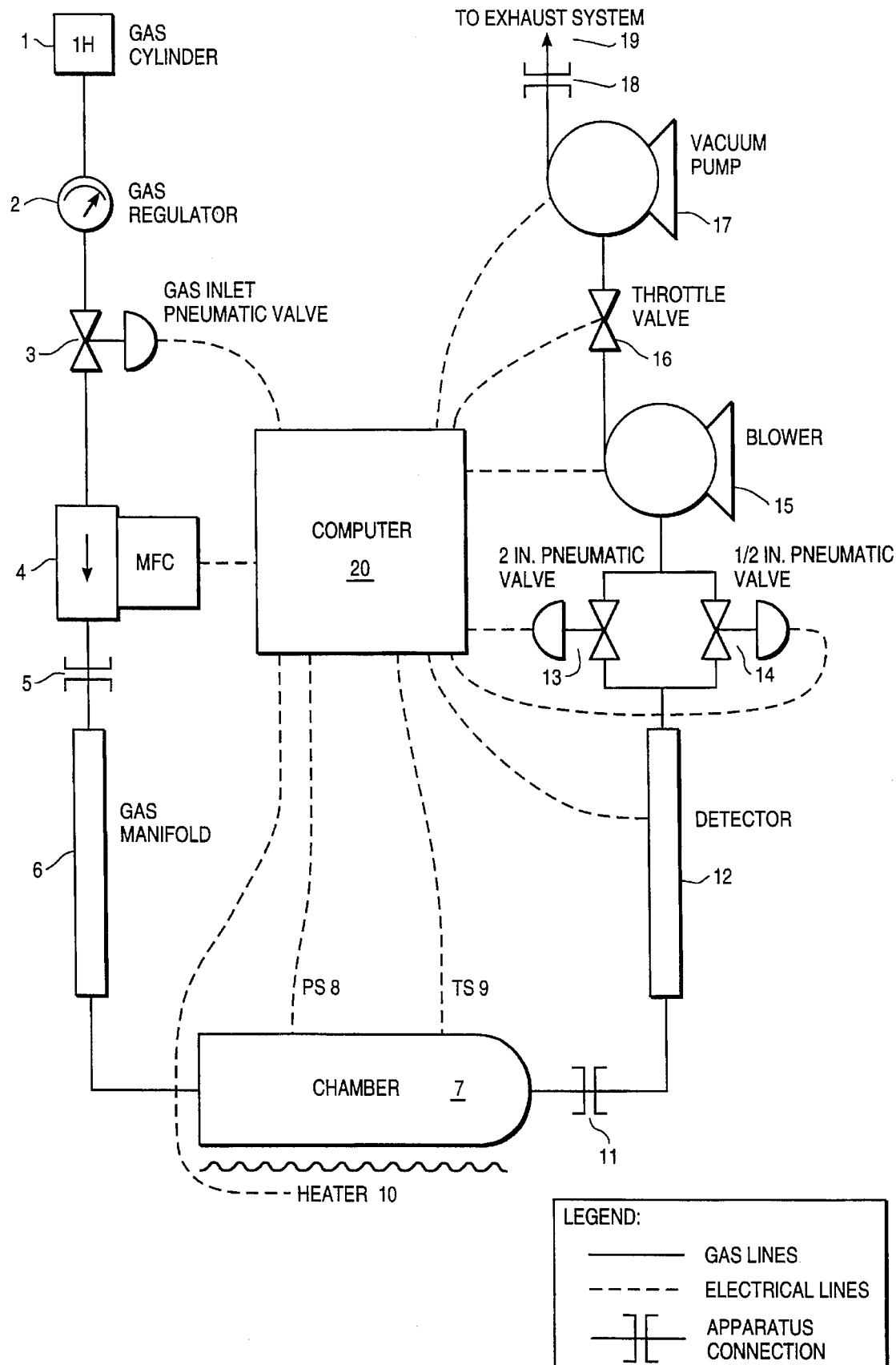
FIG_1

INTERHALOGEN CLEANING OF PROCESS EQUIPMENT

FIELD OF THE INVENTION

The present invention relates to the field of removing accumulated films from processing chambers of equipment, and particularly, to equipment whose internal pans become coated with thin films during semiconductor processing steps.

BACKGROUND OF THE INVENTION

Processing equipment in the semiconductor industry is used to make devices whose critical elements have submicron dimensions. Routine maintenance and cleaning is required to keep equipment operating properly which prevents defects in devices processed using that equipment. The current invention relates to the removal of accumulated films from semiconductor processing equipment.

Thin film deposition equipment, and to a lesser extent dry etchers, are notorious for accumulating very thick films including silicon and various metals (Ti, Mo, W, etc.) on the walls of the processing chamber and on internal parts, such as wafer carders, wafer transport mechanisms, and wafer platens, all of which are usually made of anodized aluminum, stainless steel, or quartz ($SiO_2$). A desired goal is to "clean" the chamber by removing accumulated films from the chamber walls and internal parts without attacking the material of the chamber and those internal parts. This requires that the "selectivity", which is the ratio of the etch rate of the accumulated film to the etch rate of the chamber or internal parts, be high during the cleaning process.

One prior an attempt to clean the processing chamber has included disassembling each piece of equipment and cleaning all of the pans, individually. Such a process has many inherent problems, including a large amount of time needed to disassemble the machine, clean the pans, and reassemble the machine, as well as the ever present possibility that pans become broken or misplaced during this process. Much of the equipment used in semiconductor processing requires that the wafers be processed under vacuum pressure, thus the equipment must be leaked checked after reassembly. If the machine fails its leak check, the leak in the equipment must be found which can take several hours to find. Furthermore, hairline fractures in a piece of equipment may take days to discover which is quite time consuming and very difficult.

Disassembler parts have been cleaned in one of two different methods. The first method has involved scrubbing each component part with an abrasive material such as steel wool or a Scotchbrite™ pad to remove accumulated films from the parts. This process of physically removing the accumulated film is inherently particle ridden, and therefore, these parts must be cleaned outside the fabricating area or moved to a hood or other vented portion of the fabricating area so that particles are not in the same processing areas as semiconductor wafers. If a hood or other vented areas are used within the fabricating area, costly manufacturing floor space is lost. Particles generated from this abrasive cleaning process may also be a safety hazard in that loose particles on a floor may cause people to slip and fall or if the particles are airborne, they could get into someone's eyes or become ingested.

The abrasive methods mention above have additional drawbacks, including destroying or altering delicate critical parts of the system. These methods could remove substantial amounts of the chamber material thereby requiring that the chamber walls or the internal parts be replaced sooner than normal. Another problem is that the abrasive methods scratch or make indentations in the chamber walls or internal parts which provide a location where particles accumulate. During wafer processing after the machine is reassembled, these particles could actually wind up on the wafers causing wafer yields to decrease. In extreme cases where the amount of material removed is great, the time needed to evacuate the system to a baseline pressure may take noticeably longer which adds further delays to a procedure that is already very long.

As an alternative to the mechanical methods described above, the disassembled parts could be cleaned in an acid bath with acids including HF, $H_2SO_4$, $H_3PO_4$, and $HNO_3$. While these acids react with the accumulated film to be removed, they also react with the materials that make up the chamber walls and internal parts. As an example, consider polysilicon which deposits on the walls of the quartz tube ($SiO_2$) during a typical polysilicon deposition process. To clean the quartz tube, a combination of HF and $HNO_3$ is used to etch the polysilicon, wherein, $HNO_3$ reacts with the polysilicon to from $SiO_2$ which is etched away by HF. Unfortunately, HF also etches the quartz tube which is the processing chamber for the polysilicon deposition. It is desired to etch away the polysilicon without etching any of the quartz tube or only a minimal amount of that quartz tube. HF removes the $SiO_2$ from outside of the quartz tube as well as the $SiO_2$ from polysilicon that is oxidized by the $HNO_3$. For example, a 20 µm deposition of polysilicon within a quartz tube needs to be removed. The $HNO_3$ converts the 20 µm film polysilicon film into more than 40 µm of $SiO_2$. The HF removes the more than 40 µm of $SiO_2$ of the converted polysilicon film as well as more than 40 µm of the outer tube wall since the tube is submerged in acid. Wet chemical methods involving acids have another drawback in that many metals corrode in the presence of acid severely restricting the use of acids within most processing equipment.

A further problem with wet chemical methods involves pumping down the reactor after being reassembled. The acids are normally rinsed away with water. If water remains in joints or crevices of the equipment during its first pump down, the water turns to ice which exerts great force on the joints and crevices of the equipment and could damage or destroy expensive processing equipment.

Yet another problem with disassembling the system is that water from air can be adsorbed onto the walls of the chamber and onto the surfaces of the internal pans. The water adsorbed onto the walls and the surfaces is difficult to outgas. The initial pumpdown following the reassembling may take several hours to reach a baseline pressure, thereby causing further delays in addition to the time for disassembly and reassembly as previously addressed. Also, it is possible that a long outgas period may be mistaken as a leak in the system. An agonizing leak check will be perform that does not indicate any leaks, and therefore, several man-hours will be wasted trying to find a leak that does not exist.

Another prior an attempt involves the use of plasmas which are ionized gases that react with the accumulated film while slowly reacting with the materials that make up the processing chamber and its parts. A major problem exists with plasmas in that many have etching selectivities in the range of 10:1 or less, which means that the plasma etches process walls at a rate of 10% or more of the etch rate of the accumulated film.

Use of a plasma etch suffers from additional detriments including the plasma being directed by a radio frequency (RF) field. The plasma cannot reach the cracks and crevices or more remote locations of the reactor. Thus, the accumulated film is removed from within a very specifically defined region, but rarely does it get removed from the entire chamber at one time. Either remote locations are not etched, or the removal takes several steps. For example, with polysilicon deposition systems, there is a plasma process called a Benzing process where the cantilever or other loading mechanism for the polysilicon deposition system is removed. The plasma lance is inserted into the tube and aligned which becomes more difficult as the tube length increases. After alignment, the endplate of the lance seals the tube, the tube is pumped down, allowed to stabilized at a certain pressure, $NF_3$ flows into the tube, and a plasma is struck using the RF field generated by the electrodes within the plasma lance. One problem with this approach is that $NF_3$ is highly toxic and its vapors must be controlled down to a level of less than 2500 PPM. In addition, the plasma is only going to be within a specific area, which for the polysilicon tube is the main deposition zone and would not include the bell-jar portion of the tube or the areas adjacent to the door flange. Once the Benzing process is finished, the cantilever must be reinstalled and aligned. The realignment of the cantilever is highly critical since chemical vapor depositions, such as a polysilicon deposition, are extremely dependent on the wafer location within the chamber.

Another prior art attempt to remove polysilicon uses high temperature HCl gas which is highly corrosive and should be avoided. Ideally, no etching system should require disassembling the machine, having to strike a plasma, or using highly corrosive materials such as HCl. One of the few compounds which can achieve these objectives is xenon fluoride ($XeF_2$). $XeF_2$ is very expensive making its use prohibitive for normal commercial applications where frequent etchings are required and has a low vapor pressure making its use in some applications very difficult.

SUMMARY OF THE INVENTION

In view of the foregoing, it is an important objective of the present invention to provide a method for removing an accumulated film from a substantially assembled processing chamber including any internal parts by utilizing a non-corrosive, highly selective chemical which etches accumulated films everywhere throughout the chamber, without scratching, and producing few, if any, particles.

It is an additional objective of the present invention to provide an accumulated film removal process which is time efficient and inexpensive.

It is a further objective of the present invention to provide an accumulated film removal process which utilizes chemicals that are not highly toxic and form gaseous products which are easily removed from the equipment.

It is yet an additional objective of the present invention to provide a method for removing an accumulated film close to room temperature.

It is still another objective of the present invention to provide a process which is easily adapted to existing processing equipment.

It is a major objective of the present invention to create an apparatus which achieves any or all of the previously stated objectives.

A technique for removing accumulated films from processing equipment preferably using interhalogens between about room temperature and 300° C. in accordance with the present invention is described. The invention removes accumulated films from a process chamber by introducing a compound into a process chamber of a substantially assembled machine. After the chemical is in its gaseous state, if not already a gas, a predetermined amount of time allows the gas within the chamber to diffuse and react with the accumulated film to form a gaseous product. Thereafter, the product gas and the chemical, if any is present, are removed from the chamber.

BRIEF DESCRIPTION OF THE DRAWINGS

FIG. 1 is a component diagram illustrating an example of an interhalogen apparatus designed to practice the process of the present invention.

DETAILED DESCRIPTION OF THE PRESENT INVENTION

A method and an apparatus for removing an accumulated film within a processing chamber without the problems of machine disassembly and reassembly, directional limitations of plasmas, corrosiveness of HCl, and the cost and vapor pressure of $XeF_2$ are disclosed. In the following description, numerous details are set forth, such as specific materials, process parameters, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

The present invention uses at least one interhalogen (IH) to react with an accumulated film within a processing chamber to form a gaseous product that is easily removed from the chamber. The method of the present invention is a time-efficient, inexpensive, non-corrosive, plasmaless, isotropic, and highly selective method performed on a substantially assembled processing chamber. The prior art problems involving consumption of chamber or other internal parts materials and costly additional machine downtime for disassembly and reassembly are eliminated.

Interhalogens (IHs) are molecules whose elemental composition are exclusively halogens, and heretofore have been used to etch wafers with selectivities (etch rate of the accumulated film: etch rate chamber materials) greater than 160:1 as listed in the following articles:
1. "Selective Interhalogen Etching of Tantalum Compounds and Other Semiconductor Materials" by D. E. Ibbotson, J. A. Mucha, D. L. Flamm, and J. M. Cook; Applied Physics Letters 46 (8) pages 794–796 (American Institute of Physics, ©1985).
2. "Plasmaless Dry Etching of Silicon with Fluorine-Containing Compounds" by D. E. Ibbotson, J. A. Mucha, D. L. Flamm, and J. M. Cook; Journal of Applied Physics 56 (10) pages 2939–2942 (American Institute of Physics, ©1984).
3. "Plasmaless Cleaning Process of Silicon Surface Using Chlorine Trifluoride" by Y. Saito, O. Yamaoka, and A. Yoshida; Applied Physics Letters 56 (8) pages 1119–1121 (American Institute of Physics, ©1990).

IHs have been used to etch silicon and silicon-rich compounds such as SIPOS (a silicon-rich compound of silicon and oxygen), as well as the transition metal elements and their associated compounds from semiconductor substrates. To Applicant's knowledge, IHs have not been used to remove accumulated films from processing chambers or their internal parts. Many of the IHs contain chlorine which may destroy mechanical pumps if the wrong pump oil is used, as is well known. However, in accordance with the present invention, if necessary, the mechanical pumps may be provided with a chlorine-tolerant pump oil, such as Fomblin oil.

The invention disclosed describes a specific procedure for removing an accumulated film from a polysilicon deposition tube. While the parameters and equipment used herein is specific to one type of polysilicon deposition system, the exact processing parameters and conditions used are highly dependent upon the equipment for which the present invention is used. A practitioner skilled in the art will be able to adjust the process parameters and equipment to achieve the results of the present invention. The processing options given below are presented to indicate some of the options available to a practitioner skilled in the art. The following descriptions are not intended to be limiting. The method of the current invention is given below with the presently preferred embodiment being given first and alternative embodiments following.

Before using IH, the user should make sure that the equipment will not be damaged by IH. Quartz, aluminum, stainless steel, many carbon-based polymers, and silicone are not measurably attacked by IH. If other materials are present, or the composition of the materials is unknown, material compatibility should be checked prior to using the invention. This is especially needed with newer equipment where exotic materials may be used.

The present invention when used in conjunction with a polysilicon deposition system is performed with a substantially sealed reactor so that most of the IH does not leak out of the processing chamber and so that gaseous products formed are removed by a vacuum pump. The temperature of the process chamber is adjusted between 20° C. and 100° C. prior to evacuating the chamber since temperature changes are faster at atmospheric pressure than at vacuum pressure. If contaminants within the chamber are a concern, an evacuation followed by an inert gas backfill, such as $N_2$, could be performed, so that the tube is purged and then returned to near atmospheric pressure rather than vacuum pressure for temperature stabilization. After temperature stabilization, the chamber is evacuated to less than 10 milliTorr (mT) which removes most of the gases present within the chamber. The etch process is now ready to begin. The IH is turned on and flows at about 300 standard cubic centimeters per minute (SCCM) while the chamber pressure is simultaneously adjusted between 100 and 200 mT.

A gas detector in the exhaust line senses one of the product gases, such as a silicon halide, and produces as an electronic signal similar to an endpoint detector used with plasma etch equipment. The signal indicates no product gases at the beginning, changes as the etching proceeds, and then returns to a baseline value once all the polysilicon has reacted with the IH and therefore; forms no more product gas. In the preferred embodiment, a combination of a gas detector with a predetermined timed overetch is used. The amount of overetch is preferably between 25% and 100% of the estimated etch time needed to remove the accumulated film. Following the film removal, the IH is turned off, the chamber is evacuated to less than 10 mT to remove most of the gases present within the chamber, and the chamber is backfilled with $N_2$ which returns the equipment near atmospheric pressure. The film removal process is complete and the chamber can resume normal production processing. With the invention, the process tube was not disassembled, and therefore, tests for mobile ion contamination are not needed since humans did not touch the tube.

The method of the present invention has several options available. The IH can be pure or diluted with other components, which for a polysilicon tube, may include a very small amount of HF, which is unlike the much higher HF concentration required for wet chemical etching of the tube. The concentration of the HF will be no more than 5% of the total IH composition, and ideally, is on the order of a few tenths of a percent. The HF is required by the manner in which polysilicon accumulates within a process robe. Normally, during a deposition the wafers enter into the furnace, the polysilicon is deposited, and the wafers are removed. After the wafers are removed, the cantilever is taken out of the furnace, and the polysilicon on the surface of the tube is oxidized. Because of the tremendous selectivity of IH, the IH by itself may not be able to etch the polysilicon from the walls of the tube if any $SiO_2$ is formed over or between polysilicon depositions unless a small amount of the HF is present. Therefore, the amount of HF required is only whatever is needed to remove the very thin $SiO_2$ layers that form between polysilicon depositions and should be on the order of a few tenths of a percent. This process removes much less $SiO_2$ than if the robe is submerged in HF and $HNO_3$.

IHs etch at exceedingly rapid rates (as high as 50,000 Å/minute) which could cause over-pressuring of the tube leading to a lack of pressure control or could break the tube. A relatively inert gas could be used to dilute the IH so that the etch rate is reduced since the etch rate of the mixture is relatively proportional to the partial pressure of the IH. The only requirement of the unreactive gas is that it not react with the accumulated film, chamber walls or internal parts, or the if it does, it etches at a much slower rate than the IH. Any gas that meets these criteria, such as Ar, He, and $N_2$, could be used as a diluting gas for the IH process. For processing equipment which normally operates at pressures above the vapor pressure of the IH, the diluting gases can be added so that the pressure of the mixture of IH and diluting gas is similar to the operating pressure of the equipment where an accumulated film is to be removed.

The temperature of the chamber with the preferred embodiment is between 20° C. and 100° C. while in an alternate embodiment, the temperature may be between 0° C. and 300° C. There is no know restriction on temperature, however, the reaction should take place no higher than 300° C. since selectivities generally decrease with increasing temperature. Once the temperature gets too high, the selectivity could become low enough so as to damage the chamber walls and internal parts. This does not mean that the present invention cannot be performed above 300° C., but only that the selectivity may noticeably decline above 300° C. Along a similar line, in the currently preferred embodiment, the partial pressure of the IH is between 100 and 200 mT, although the invention could remove the accumulated film at IH partial pressures between 50 and 500 mT. If the pressure is too high, the selectivity could decrease in a manner similar to higher temperature, and too low of a pressure may give unacceptably low accumulated film etch rates (see the previous discussion regarding $XeF_2$).

The IH does not need to enter the process chamber as a gas, although this is preferred due to the ease of the handling gaseous IH. The IH must be in a gaseous state during the reaction within the chamber so that the IH can get everywhere within the chamber so that the accumulated film is removed. The chamber pressure is adjusted lower than the vapor pressure of the IH thereby ensuring that the IH is in its gaseous state when the reaction with the accumulated film occurs. The actual pressure depends upon the chamber temperature and the specific IH chemical used, and the equipment for which the present invention is being utilized. If other chemicals are present with the IH, the vapor pressure of the IH mixture is dependent upon those other compounds in addition to the vapor pressure of the pure IH, itself.

The IH flow rate is about 300 SCCM, although no limit is known, and therefore, the flow rate could be 1 SCCM or 20 standard liters per minute or beyond. Since most applications involve vacuum pressure, the upper flow rate is usually limited by the vacuum pump's ability to regulate the chamber pressure. In addition, a higher IH flow rate could overpressure the tube. If the IH flow rate is too low for the mass flow controller (MFC) to control, gas dilution could be used to increase the flow rate through the MFC.

The preferred embodiment uses a combination of a gas detector set to sense a product gas, such as a silicon-halide gas and a predetermined timed overetch. Many alternatives are available for determining the length of the process. A predetermined time can be used, but if the time selected is incorrect, the process could underetch leaving residual accumulated film or could have excessive overetch which interferes with valuable production time. The gas detector could be set for a reactive gas, which could be IH or HF for the polysilicon deposition tube, as detected in the exhaust line wherein the process continues until the IH concentration reaches a predetermined concentration. For simplicity, the reactive gas is referred to as IH hereafter in this application. A detector could sample an IH concentration in the inlet and outlet and by comparing the two, the process continues until the concentration in the inlet and outlet are within a predetermined range. Separate detectors for the inlet and exhaust lines could be used to detect an IH concentration, but this method has the additional drawback of possible offset between the two detectors, further complicating the process.

The film removal process can take one of two different forms: a continuous process or a discrete step process. As a continuous process, which is the preferred embodiment, IH is fed into the chamber at the same time the product is withdrawn. Necessarily, all of the intermediate steps including stabilizing the pressure, adjusting the temperature (if there is such a requirement), and allowing enough time for the chemical to get to the accumulated film and react, occur simultaneously. The process continues until the accumulated film is removed.

The invention could be practiced as a discrete step process such that IH is fed into the chamber at a time different from when gases are removed from the chamber. With discrete steps, a cycle is formed which includes all of the individual discrete steps. It is possible with the discrete step process that more than one cycle is needed to remove all of the film, and therefore, the cycle is repeated until all of the accumulated film is removed. Depending on the etch rates and the time needed to etch away the material, a continuous or discrete step process could be selected. As the time to remove all of the film increases, the continuous process in preferred. If the accumulated film has a high etch rate, or all film can be removed in one or two cycles, a discrete step process may be chosen.

Having discussed the processing considerations, an apparatus for executing the method is described below. Before entering into the details of the apparatus, the difference between equipment and system must be understood. The apparatus is connected to a process chamber which is part of a piece of equipment. The combination of the apparatus and equipment when connected together form the system.

In its simplest form, the system consists of three parts: an inlet section, a chamber section, and a vacuum section. While the preferred embodiment of the system is shown in FIG. 1, it is not intended to limit the invention, but to illustrate one way in which the present invention may be designed. The inlet section of the system introduces the gas into the chamber and is made up of a gas cylinder 1 which includes an IH, a gas pressure regulator 2 which is used to adjust the pressure of the gas, an electronically controlled gas inlet pneumatic valve 3 to act as a shutoff valve for the gas prior to a mass flow controller MFC 4, a MFC 4 which controls the flow rate of the gas into the chamber 7, and a gas manifold 6. The apparatus is connected to the equipment at an apparatus connection 5, and therefore, the gas manifold 6 is part of the equipment.

The chamber section includes the chamber 7 itself, which is where the accumulated material collects, a pressure sensor PS 8 which senses the pressure of the chamber and feeds the signal to a computer 20, and a temperature control subsystem of the chamber 7. The temperature control subsystem is maintained by using a temperature sensor TS 9 which senses the temperature of the chamber and feeds the signal to the computer 20, at which time the computer 20 sends instructions to a heater 10 to start, stop, or continue heating the chamber 7. The chamber section is connected to the apparatus at an apparatus connection 11.

Downstream from the chamber section is the vacuum section. The gases from the chamber 7 enter a detector 12 which is set to sense a product gas. The signal generated from the detector 12 is fed to a computer 20 which determines if the signal is within a predetermined limit. The vacuum section also includes a pair of electronically controlled pneumatic valves (valves 13 and 14) which control the rate and amount of vacuum pressure that is drawn by the vacuum section. The remaining portion of the vacuum section consists of a blower 15 which helps feed gas to a vacuum pump thereby increasing the pumpdown rate of the chamber 7, a throttle valve 16 which is used to regulate the chamber pressure as sensed by PS 8 and controlled by a computer 20, and a vacuum pump 17 which draws the vacuum for the system. The vacuum section of the apparatus is connected to the equipment's exhaust system 19 at an apparatus connection 18. Having briefly described the system, the method of operation is described immediately below.

Once all of the apparatus connections to equipment are made, the apparatus idles meaning that all pneumatic valves (3, 13, and 14) within the system are closed, and the vacuum pump is running with the throttle valve 16 wide open and the blower 15 off. When the process starts, the temperature of the process chamber is adjusted as previously described, if required, prior to evacuation since temperature changes are quicker when the chamber 7 is near atmospheric pressure. Following temperature adjustments, if any, the computer 20 sends a signal to the ½" pneumatic valve 14 to open which takes the pressure down to about 500 mT as sensed by PS 8. When the computer 20 receives the signal from PS 8 that the chamber pressure is below 500 mT, the computer 20 sends signals to the 2" pneumatic valve 13 to open and to the blower 15 to turn on. The vacuum section pumps down chamber 7 to a baseline evacuation pressure of less than 10 mT. The exact pressures when valve 13 opens and the blower 15 turns on, as well as the baseline evacuation pressure are not critical to the invention. The pressures given above represent the currently preferred embodiment, yet the pressures can be optimized to the user's equipment.

The etch process is now ready to begin. MFC 4 has a setpoint of zero when valve 3 opens, when immediately thereafter, MFC 4 begins to ramp up and system pressure is increased to the desired pressure of the cleaning process by partially closing the throttle valve 16. In the preferred embodiment, a gas flow rate of 300 SCCM and a pressure of 200 mT is desired which is accomplished by the computer 20 sending a signal to MFC 4 to ramp the flow rate from 0 to 300 SCCM in a minute and the computer 20 sensing the chamber pressure by a signal sent by PS 8 while adjusting throttle valve 16 so that the chamber pressure goes from the baseline evacuation pressure to 200 mT during the same minute. A step-function change in the gas flow rate or pressure could be done, but because of the quartz tube used as the chamber for a polysilicon deposition process, a sudden pressure change could result in severe damage to the chamber 7. The actual film removal conditions are dependent upon the equipment used. A practitioner skilled in the art will be able to adjust a system to achieve the results of the present invention.

Once the gas flows from the gas cylinder 1 into the chamber 7, the gas diffuses to the surfaces of the chamber walls and internal parts and reacts with the accumulated films on those surfaces. Detector 12 is set to sense a product gas, which for a polysilicon deposition system is a silicon-halide gas, and sends a signal to the computer 20 which varies with the concentration of the product gas present at the detector 12. The signal starts at one value prior to detecting any silicon halide, changes as the amount of silicon halide increases, and then returns to the initial level once all of the accumulated material has reacted since no more silicon halide is produced. Once the detector 12 signal reaches a predetermined level, the computer 20 determines that little, if any, accumulated film is still present in chamber 7. Computer 20 starts a timer (not shown) to give the desired overetch using a predetermined time. The cleaning portion of the process is completed once the time expires.

After the cleaning process is finished, the system enters the shutdown portion of the process. Computer 20 sends a signal to MFC 4 to ramp the gas flow rate down to 0 SCCM. Following the ramp down, the computer 20 sends signals to valve 3 to close and to throttle valve 16 to open wide which evacuates all product gases and any unreacted IH, if any is present, from chamber 7 at which time the chamber pressure eventually reaches less than 10 mT. After a couple of minutes at low pressure, the computer 20 closes valves 13 and 14, turns off blower 15, and backfills the system between gas inlet valve 3 and the vacuum section valves 13 and 14 with an inert gas such as $N_2$ (not shown) which is plumbed into gas manifold 6. Once the chamber reaches atmospheric pressure, the apparatus is disconnected, and the chamber is returned to its operating state.

The basic apparatus can be modified in several different ways which are listed hereafter. The list is not intended to be limiting, but to illustrate other alternatives that are available. The IH could enter the processing chamber via one of a few possible different mechanisms, the easiest being a pressure gradient drop. For a continuous process, all the valves between the gas cylinder 1 and the vacuum pump 17 are opened, and the IH enters the chamber 7 under a vacuum pulled by the vacuum section as described in the preferred embodiment. For a discrete step process, the chamber 7 is evacuated by the vacuum section, after which pneumatic valves 13 and 14 are closed and valve 3 is opened. As an alternative for either process, IH could be forced into the chamber 7 by a pump (not shown) installed between the gas cylinder 1 and the chamber 7.

The pressure is controlled by the gas inlet pressure, by using other gases or pressure relief lines connected directly to the processing chamber, or by regulating the vacuum pulled by the vacuum section. When the gas inlet pressure is used, the gas regulator 2 is used to adjust the gas inlet pressure and determines the pressure of the chamber 7. MFC 4 is not required since the gas flows until the pressure in the chamber 7 is nearly equal to that of the gas regulator 2. This type of system can be used with a discrete step process. Another option uses a second gas line (not shown) that is either connected to the gas manifold 6 or is plumbed directly to the chamber 7. Still another way to regulate the pressure directly from the chamber 7 uses pressure relief valve (not shown), so that when certain chamber pressure is reached, the pressure relief valve opens and is vented to atmosphere or to an exhaust line.

The temperature of the system is sensed by TS 9 and a heater 10 or a cooler (not shown) is adjusted accordingly. TS 9 may be one of several different types of temperature sensing devices including a thermometer, a thermocouple, an optical pyrometer, an infrared detector, and other electromagnetic temperature detectors. TS 9 is normally connected to the chamber 7 since the IH must be a gas within the chamber 7 during the reaction, although the gas inlet temperature could be sensed (not shown). In the preferred embodiment, a thermocouple is used and sends a signal to the computer 20 which adjusts the heater or cooler accordingly.

The pressure is sensed by a pressure sensor within the gas line (not shown), the chamber 7 (as shown as PS 8), or the line to the vacuum section (not shown). Since the IH must be in a gaseous phase within the chamber 7, the pressure sensor should be connector to the chamber. In the preferred embodiment, an electronic pressure transducer is used, although a mechanical pressure gauge or manometer could be used. If the process is controlled by the gas inlet pressure, no pressure sensor is needed since the pressure is determined by the gas regulator 2. Throttle valve 16 is controlled to give the correct pressure for instances where the gas inlet pressure is not used for the processing pressure.

Sufficient time is allowed for the IH to diffuse to the surfaces and react with the accumulated film. The time needed for this process depends on the volume of the chamber 7, the gas flow rate, the chamber pressure and temperature, the thickness of the accumulated film, and the etch rate of the accumulated film, and therefore, experiments may be required. The preferred embodiment uses a detector 12 with a timed overetch. Once a time is determined, it is programmed into the computer 20, or with manual control, the operator intervenes to stop the process. The etch process could be completely timed, but there is a possibility of underetch or excessive overetch which has been discussed previously.

At the end of the film removal process, product gases and unreacted IH, if any is present, are removed from the chamber 7, which in the preferred embodiment, is accomplished by closing valve 3, ramping the MFC 4 down to 0 SCCM, and opening throttle valve 16 to evacuate the system to less than 10 mT. Chamber 7 could be backfilled with a relatively inert gas such as $N_2$ and pumped down again to further ensure that all of the product gases and IH, if any is present, are removed from chamber 7. An inert gas could flush out the chamber if no vacuum pump is present, or the chamber could be opened to atmosphere if safety or environmental concerns are not an issue.

The vacuum section has one of three different types of pumping arrangements: a mechanical pump, a combination of a blower with a mechanical pump, or a turbo-pump. The pressure of the reaction is around 100 to 200 mT, which most mechanical pumps easily achieve. If the processing chamber has a relatively large volume, a blower should be used to aid pumping down the chamber. A turbo-pump can obtain pressures down to the level of 1E-8 torr, but could be used if it can operate between 100 and 200 mT.

Preferably, only small modification to existing equipment is all that is needed. Many different types of equipment have most of the items illustrated in FIG. 1. A Thermco TMX 9002 polysilicon deposition furnace has the elements of the system downstream of MFC 4 which includes the furnace computer. This furnace is designed to easily accommodate an additional gas lines making modification quite simple for a practitioner skilled in the art. Gas cylinder 1, gas regulator 2, valve 3, and MFC 4 are part of the new gas line. An electronically controlled pneumatic valve (not shown) similar to valve 3 could be installed between the MFC 4, and the connection 5, so that MFC 4 can be isolated from the balance of the gas line since MFCs require periodic calibration. The gas line is plumbed into the gas manifold 6. The electronic controls for the MFC 4 and its associated pneumatic valves are connected to a gas interface board while software changes to the programs and tables of the computer 20 are made so that the computer 20 knows that an additional gas line is currently present in the system. Modifications for other types of equipment should be along similar lines.

The system is computer controlled as illustrated in FIG. 1. The computer control is performed by the equipment computer, the apparatus computer, or a combination of the equipment and apparatus computer. For a Thermco TMX 9002 polysilicon deposition furnace, the equipment computer operates the process shown in FIG. 1, and therefore, an apparatus computer is not needed. If needed, an apparatus computer can assist the equipment computer as many types of semiconductor equipment have a SECS port which is an RS 232 connection normally mounted on a circuit board within the equipment computer so that it can communicate with another computer, such as the apparatus computer. A practitioner skilled in the art can determine the computer requirements needed for the equipment being used.

In the preferred embodiment, the process is automatically controlled, but manual control could be utilized. The electronic pneumatic valve 3 could be replaced by manual pneumatic valve or a hand-operated valve. The IH gas flow rate is controlled by the gas regulator 3, and therefore, MFC 4 is not required. The system vacuum is controlled by adjusting a manual throttle valve which replaces the electronically controlled throttle valve 16. The process is manually started, timed, shut down. The automatic process requires the operator to start the process which could include compiling a program and pressing a button (a couple of minutes). The manual procedure requires substantial operator interfacing and takes about one man-hour of labor for the process.

The previous description of the method and apparatus used a polysilicon tube for the example, but the invention can be applied to other process equipment including metal or other film deposition equipment and dry etching equipment. The user may need to make slight modifications based on the actual equipment used, but practitioners skilled in the art can determine these considerations and modify the method or apparatus disclosed to meet their needs.

Thus, a method and apparatus for removing accumulated films from processing chambers has been described.

I claim:

1. A method of removing an accumulated certain processing material from a substantially assembled machine, said machine which includes a processing chamber having an internal part which defines an exposed surface such that when said material is present within said chamber, said material tends to accumulate onto said surface, said material reacting with an interhalogen (IH) to form a gaseous product which is readily removed from said surface when exposed to said IH, said method comprising the steps of:

a) introducing said IH into said chamber;
    b) subjecting said chamber to a predetermined pressure to ensure that said IH is in its gaseous phase.
    c) allowing a predetermined time for said IH to diffuse to said surface and to react with substantially all of said material to form a gaseous product without significantly etching said surface; and
    d) removing from said chamber said gaseous product and unreacted gaseous IH, if any is present.

2. The method of claim 1 wherein said IH includes at least one IH selected from the group consisting of F, $F_2$, ClF, $ClF_3$, $BrF_3$, $BrF_5$, $IF_5$, and any combination thereof.

3. The method of claim 1 wherein said IH is part of a mixture.

4. The method of claim 3 wherein said mixture includes HF.

5. The method of claim 3 wherein said mixture is diluted with a gas which does not significantly react with said material and said surface thereby reducing an etch rate of said mixture.

6. The method of claim 1 wherein a partial pressure of said IH is between 50 mT and 500 mT.

7. The method of claim 1 wherein said chamber is at a temperature between 0° C. and 300° C. during said predetermined time.

8. The method of claim 1 wherein a partial pressure of said IH during said reacting is no greater than a vapor pressure of said IH at a temperature of said chamber and during said predetermined time.

9. The method of claim 1 wherein said material comprises at least one chemical selected from the group consisting of Si, SIPOS, W, $WSi_2$, Ta, TaSi, $Ta_2N$, Ti, TiN, TiW, Mo, and any combination thereof.

10. The method of claim 1 wherein said surface comprises at least one substance selected from the group consisting of Al, stainless steel, $SiO_2$, a carbon-based polymer, silicone, and any combination thereof.

11. The method of claim 1 wherein said predetermined time is no more than five hours.

12. The method of claim 1 wherein said predetermined time is between a quarter minute and one hour.

13. The method of claim 1 wherein steps a) to d) occur simultaneously during at least a portion of said method.

14. The method of claim 1 wherein steps a) to d) define one cycle, said cycle being repeated until substantially all of said material is removed.

15. The method of claim 1 wherein said surface is selected from a group consisting of an internal wall of said chamber and a component within said chamber.

16. A method of removing an accumulated certain processing material from a substantially assembled machine, said machine which includes a processing chamber having an internal part which defines an exposed surface such that when said material is present within said chamber, said material tends to accumulate onto said surface, said material plasmalessly reacting with a certain compound between about 0° C. and 300° C. to form a gaseous product which is readily removed from said surface when exposed to said compound, said method comprising the steps of:

a) regulating said chamber to a predetermined temperature, if required;

b) introducing said compound into said chamber;

c) subjecting, said chamber to a predetermined pressure to ensure that said compound is in its gaseous phase;

d) allowing a predetermined time for said compound to diffuse to said surfaces and to plasmalessly react with substantially all of said material to form a gaseous product, without significantly etching said surface; and e) removing from said chamber said gaseous product and any unreacted gaseous compound, if any is present.

17. The method of claim 16 wherein said compound includes an interhalogen (IH).

18. The method of claim 17 wherein said IH includes at least one IH selected from the group consisting of F, $F_2$, ClF, $ClF_3$, $BrF_3$, $BrF_5$, $IF_5$, and any combination thereof.

19. The method of claim 17 wherein a partial pressure of said compound during said reacting is no greater than a vapor pressure of said compound at a temperature of said chamber and during said predetermined time.

20. The method of claim 16 wherein said compound includes HF.

21. The method of claim 16 wherein said compound is diluted with a gas which does not significantly react with said material and said surface thereby reducing an etch rate of said compound.

22. The method of claim 16 wherein a partial pressure of said compound is between 50 mT and 500 mT.

23. The method of claim 16 wherein said material comprises at least one chemical selected from the group consisting of Si, SIPOS, W, $WSi_2$, Ta, TaSi, $Ta_2N$, Ti, TiN, TiW, Mo, and any combination thereof.

24. The method of claim 16 wherein said surface comprises at least one substance selected from the group consisting of Al, stainless steel, $SiO_2$, a carbon-based polymer, silicone, and any combination thereof.

25. The method of claim 16 wherein said predetermined time is no more than about five hours.

26. The method of claim 16 wherein said predetermined time is between a quarter minute and one hour.

27. The method of claim 16 wherein steps a) to e) occur simultaneously during at least a portion of said method.

28. The method of claim 16 wherein steps a) to e) define one cycle, said cycle being repeated until substantially all of said certain material is removed.

29. The method of claim 16 wherein said surface is selected from a group consisting of an internal wall of said chamber and a component within said chamber.

30. For use with a substantially assembled machine which includes a processing chamber having an internal part which defines an exposed surface such that when a certain processing material is present within said chamber, said material tends to accumulate onto said surface, said material reacting with an interhalogen (IH) to form a gaseous product which is readily removed from said surface when exposed to said IH, an apparatus for removing said material from said surface comprising:

a) means for introducing said IH into said chamber;

b) means for subjecting said chamber to a predetermined pressure to ensure that said IH is in its gaseous phase.

c) means for allowing a predetermined time for said IH to diffuse to said surface and to react with substantially all of said material to form a gaseous product without significantly etching said surface; and d) means for removing from said chamber said gaseous product and unreacted gaseous IH, if any is present.

31. The apparatus of claim 30 wherein said means for introducing said IH into said chamber includes a pressure gradient between a gas inlet and said processing chamber such that a gas inlet pressure is higher than a processing chamber pressure.

32. The apparatus of claim 31 wherein said pressure gradient is maintained by a feeding pump.

33. The apparatus of claim 30 wherein said means for subjecting said chamber to a predetermined pressure is selected from the group consisting of regulating a gas inlet line pressure, using a pressure-actuated vent connected to said chamber, and regulating a vacuum pressure maintained by a vacuum pump connected to said chamber.

34. The apparatus of claim 33 further comprising a second gas inlet line having a second gas inlet line pressure, wherein said gas inlet line pressure and said second gas inlet line pressure are determined by pressure regulators.

35. The apparatus of claim 33 wherein said pressure-activated vent is a pressure relief valve.

36. The apparatus of claim 33 further comprising a throttle throttle valve between said chamber and said vacuum pump, wherein said valve regulates said vacuum pressure.

37. The apparatus of claim 30 wherein said means for allowing a predetermined time is selected from the group consisting of a timer and a gas detector connected to an exhaust line of said chamber.

38. The apparatus of claim 37 wherein said detector senses said gaseous product such that a film removal process is detected as complete when said detector senses a concentration of said gaseous product in said exhaust line is below a predetermined level.

39. The apparatus of claim 37 wherein said detector senses an inlet gas such that a film removal process is detected as complete when said detector senses that a concentration of an inlet gas in said exhaust line is within a predetermined level of a original concentration of said inlet gas within a gas inlet line.

40. The apparatus of claim 30 wherein said means for removing said gaseous product includes maintaining a pressure gradient between said chamber and an exhaust line.

41. The apparatus of claim 40 wherein said pressure gradient is maintained by pressurizing said chamber to a higher pressure than a pressure of said exhaust line by introducing an inert gas into said chamber until said higher pressure is achieved.

42. The apparatus of claim 41 wherein said exhaust line is placed under vacuum by equipment selected from a group consisting of a mechanical pump, a combination of a blower and a mechanical pump, and a turbo-pump.

43. For use with a substantially assembled machine which includes a processing chamber having an internal part which defines an exposed surface such that when a certain processing material is present within said chamber, said material tends to accumulate onto said surface, said material plasmalessly reacting with a compound between 0° C. and 300° C. to form a gaseous product which is readily removed from said surface when exposed to said compound, an apparatus for removing said material from said surface comprising:

a) means for regulating said chamber to a predetermined temperature, if required;

b) means for introducing said compound into said chamber;

c) means for subjecting said chamber to a predetermined pressure to ensure that said compound is in its gaseous phase;

d) means for allowing a predetermined time for said compound to diffuse to said surface and to plasmalessly react with substantially all of said material to form a gaseous product without significantly etching said surface; and e) means for removing from said chamber said gaseous product and any unreacted gaseous compound, if any is present.

44. The apparatus of claim 43 wherein said means for regulating said chamber to a predetermined temperature comprises both means for temperature sensing and means for temperature control.

45. The apparatus of claim 44 wherein said means for temperature sensing comprises a temperature sensor selected from a group consisting of a thermometer, thermocouple, optical pyrometer, infrared detector, and other electromagnetic means for determining temperature.

46. The apparatus of claim 44 wherein said means for temperature control is selected from the group of heating said chamber, cooling said chamber, heating said compound prior to entering said chamber, and cooling said compound prior to entering said chamber.

47. The apparatus of claim 43 wherein said means for introducing said compound into said chamber includes a pressure gradient between a gas inlet and said processing chamber such that a gas inlet pressure is higher than a chamber pressure.

48. The apparatus of claim 47 wherein said pressure gradient is maintained by a feeding pump.

49. The apparatus of claim 43 wherein said means for subjecting said chamber to a predetermined pressure is selected from the group consisting of regulating a gas inlet line pressure, using a pressure-actuated vent connected to said chamber, and regulating a vacuum pressure maintained by a vacuum pump connected to said chamber.

50. The apparatus of claim 49 further comprising a second gas inlet line having a second gas inlet pressure, wherein said gas inlet line pressure and said second gas inlet pressure are determined by pressure regulators.

51. The apparatus in claim 49 wherein said pressure-activated vent is a pressure relief valve.

52. The apparatus of claim 49 further comprising a throttle throttle valve between said chamber and said vacuum pump, Wherein said valve regulates said vacuum pressure.

53. The apparatus of claim 43 wherein said means for allowing a predetermined time is selected from the group consisting of a timer and a detector connected to an exhaust line of said chamber.

54. The apparatus of claim 53 wherein said detector is attached to said exhaust line and senses said gaseous product such that a film removal process is detected as complete when said detector senses that a concentration of said gaseous product in said exhaust line is below a predetermined level.

55. The apparatus of claim 53 wherein said detector senses said compound gas such that a film removal process is detected as complete when said detector senses that a concentration of said compound in said exhaust line is within a predetermined level of an original concentration of said compound within a gas inlet line.

56. The apparatus of claim 43 wherein said means for removing said gaseous product includes maintaining a pressure gradient between said chamber and an exhaust line.

57. The apparatus of claim 56 wherein said pressure gradient is maintained by pressurizing said chamber to a higher pressure than a pressure of said exhaust line by introducing an inert gas into said chamber until said higher pressure is achieved.

58. The apparatus of claim 57 wherein said exhaust line is placed under vacuum by equipment selected from a group consisting of a mechanical pump, a combination of a blower and a mechanical pump, and a turbo-pump.

* * * * *